United States Patent
Lee et al.

(10) Patent No.: US 9,871,492 B2
(45) Date of Patent: Jan. 16, 2018

(54) ANALOG AMPLIFIER FOR RECOVERING ABNORMAL OPERATION OF COMMON MODE FEEDBACK

(71) Applicant: Samsung Electronics Co., Ltd., Suwon-si, Gyeonggi-do (KR)

(72) Inventors: Jong-Woo Lee, Seoul (KR); Byung-Hak Cho, Seongnam-si (KR); Jae-Hyun Lim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/712,267

(22) Filed: May 14, 2015

(65) Prior Publication Data

US 2015/0249435 A1   Sep. 3, 2015

Related U.S. Application Data

(63) Continuation of application No. 14/016,704, filed on Sep. 3, 2013.

(30) Foreign Application Priority Data

Sep. 3, 2012   (KR) .................. 10-2012-0097396

(51) Int. Cl.
   *H03F 3/45* (2006.01)
   *H03F 3/183* (2006.01)
   *H03G 3/30* (2006.01)

(52) U.S. Cl.
   CPC ......... *H03F 3/183* (2013.01); *H03F 3/45183* (2013.01); *H03F 3/45475* (2013.01); *H03G 3/3005* (2013.01); *H03F 2200/21* (2013.01); *H03F 2200/555* (2013.01); *H03F 2203/45522* (2013.01); *H03F 2203/45528* (2013.01); *H03F 2203/45591* (2013.01);
   (Continued)

(58) Field of Classification Search
   CPC ....................................................... H03F 3/45
   USPC ........................................ 330/258, 253, 261
   See application file for complete search history.

(56) References Cited

U.S. PATENT DOCUMENTS 6,400,207 B1   6/2002   Ivanov et al.
7,365,600 B1   4/2008   Lokere
(Continued)

FOREIGN PATENT DOCUMENTS

EP   0 168 198 A2   1/1986
JP   2-92008 A   3/1990

*Primary Examiner* — Henry Choe
(74) *Attorney, Agent, or Firm* — Jefferson IP Law, LLP

(57) ABSTRACT

An analog amplifier is provided. The analog variable amplifier includes a first amplifier stage configured to amplify a bias current to output a first output voltage and a second output voltage that respectively depend on a magnitude of a first input voltage and a second input voltage, a second amplifier stage configured to receive the first output voltage and the second output voltage of the first amplifier stage as inputs and to amplify the received first output voltage and the second output voltage, and at least one auxiliary bias current source coupled to an electrical connection between the first amplifier stage and the second amplifier stage through which the second amplifier stage receives the first output voltage, and coupled to an electrical connection between the first amplifier stage and the second amplifier stage through which the second amplifier stage receives the second output voltage.

19 Claims, 4 Drawing Sheets

(52) U.S. Cl.
    CPC ............ *H03F 2203/45594* (2013.01); *H03F 2203/45686* (2013.01); *H03F 2203/45702* (2013.01)

(56) References Cited

U.S. PATENT DOCUMENTS

| | | | |
|---|---|---|---|
| 7,711,128 B2 | 5/2010 | Hagino | |
| 7,816,992 B2 | 10/2010 | Tanaka et al. | |
| 8,237,693 B2 * | 8/2012 | Nishimura | G09G 3/3688 330/252 |
| 8,330,199 B2 | 12/2012 | Kamakura et al. | |
| 8,461,922 B2 | 6/2013 | Norman | |
| 8,791,758 B1 | 7/2014 | Foroudi | |
| 8,872,586 B2 | 10/2014 | Hsieh | |
| 9,390,671 B2 | 7/2016 | Min et al. | |

* cited by examiner

ANALOG AMPLIFIER FOR RECOVERING ABNORMAL OPERATION OF COMMON MODE FEEDBACK

CROSS-REFERENCE TO RELATED APPLICATION(S)

This is a continuation application of a U.S. patent application Ser. No. 14/016,704, filed Sep. 3, 2013; which claims the benefit under 35 U.S.C. §119(a) of a Korean patent application filed on Sep. 3, 2012 in the Korean Intellectual Property Office and assigned Serial number 10-2012-0097396, the entire disclosure of which is hereby incorporated by reference.

TECHNICAL FIELD

The present disclosure relates to an analog amplifier for amplifying or attenuating an analog signal and an electronic device thereof.

BACKGROUND

As a result of a continuous increase in the integration degree and reliability of an integrated circuit, an analog circuit and a digital circuit are integrated and developed in one chip. Also, an analog circuit and a system play an important role in realization and application of a high-density Integrated Circuit (IC) technology. For example, nearly all high-density IC systems employ an amplifier, a filter, a detector, a comparator, etc.

FIG. 1 illustrates an analog filter structure where analog variable amplifiers are configured in two stages according to the related art.

Referring to FIG. 1, an analog variable amplifier 100 of a first stage includes an operational amplifier and two variable resistors $R_1$ and $R_2$. Depending on the implementation, the analog variable amplifier 100 of the first stage may include one variable resistor and one variable capacitor instead of the operational amplifier and the two variable resistors $R_1$ and $R_2$.

Likewise, an analog variable amplifier 102 of a second stage includes an operational amplifier and two variable resistors $R_3$ and $R_4$. Depending on the implementation, the analog variable amplifier 102 of the second stage may include one variable resistor and one variable capacitor instead of the operational amplifier and the two variable resistors $R_3$ and $R_4$.

In each analog variable amplifier stage, a gain is determined by a ratio of the input resistors $R_1$ and $R_3$ to the feedback resistors $R_2$ and $R_4$. Assuming a transfer function of the operational amplifier is $A(s)$, the gain is expressed below by Equation (1). In an ideal operational amplifier, a gain has a value of $R_2/R_1$ or $R_4/R_3$ in its infinity. Also, the gain of the entire circuit is represented as product (G1×G2) of gains at respective stages. Here, G1 is the gain of the analog variable amplifier 100 of the first stage, and G2 is the gain of the analog variable amplifier 102 of the second stage.

$$G_1 = \frac{R_2 A(s)}{R_1 + R_2 - R_1 A(s)} \quad \text{Equation (1)}$$

$$G_2 = \frac{R_4 A(s)}{R_3 + R_4 - R_3 A(s)}$$

Here, the variable gain amplifier is configured by controlling the values of the input resistors $R_1$ and $R_3$ or the feedback resistors $R_2$ and $R_4$. In the analog variable amplifier 100 of the first stage, when $R_1$ is greater than $R_2$, the variable gain amplifier performs attenuation. When $R_1$ is less than $R_2$, the variable gain amplifier performs amplification. Likewise, in the analog variable amplifier 102 of the second stage, when $R_3$ is greater than $R_4$, the variable gain amplifier performs attenuation. When $R_3$ is less than $R_4$, the variable gain amplifier performs amplification.

Meanwhile, in a case of configuring an analog amplifier requiring a range from −40 dB or less to 0 dB or more, an analog filter processes a wide operation range via two or more analog amplifier stages. For example, a first analog amplifier stage processes −20 dB or less to ~0 dB or more, and a second analog amplifier stage processes −20 dB or less ~0 dB or more, so that the entire gain becomes −40 dB or less ~0 dB or more.

However, an analog filter including a plurality of amplifier stages consumes twice more power compared to the case where one amplifier stage amplifies an analog signal, and requires twice more area, so that manufacturing costs increase.

Therefore, there is a need for an analog amplifier including a single amplifier stage.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide an operational amplifier circuit that can realize a wide operation range required by an analog amplifier using only one stage.

Another aspect of the present disclosure is to provide an analog circuit having low power consumption and a small area by preventing a phenomenon that a ratio of input resistance to feedback resistance becomes very large and so an operation of an input transistor is blocked, to widen an operation range.

Still another aspect of the present disclosure is to provide an analog gain amplifier having a high efficiency and an improved yield.

In accordance with an aspect of the present disclosure, an analog variable amplifier is provided. The analog variable amplifier includes a first input transistor and a second input transistor configured to amplify a bias current depending on a magnitude of a first input voltage and a second input voltage, a first output transistor and a second output transistor configured to output the amplified bias current, a third transistor and a fourth transistor configured to receive an output voltage of the first output transistor as an input and to amplify the received output voltage, a first current source configured to provide a predetermined current between the first output transistor and the third transistor, a fifth transistor and a sixth transistor configured to receive an output voltage of the second output transistor as an input and to amplify the received output voltage, and a second current source configured to provide a predetermined current between the second output transistor and the fifth transistor.

In accordance with another aspect of the present disclosure, an operational amplifier is provided. The operational amplifier includes a first stage and a second stage of the operational amplifier, and a current source between the first stage and the second stage to prevent a voltage of an input transistor of the operational amplifier from dropping down a threshold or less.

In accordance with yet another aspect of the present disclosure, an analog amplifier is provided. The analog variable amplifier includes a first amplifier stage configured to amplify a bias current to output a first output voltage and a second output voltage that respectively depend on a magnitude of a first input voltage and a second input voltage, a second amplifier stage configured to receive the first output voltage and the second output voltage of the first amplifier stage as inputs and to amplify the received first output voltage and the second output voltage, and at least one auxiliary bias current source coupled to an electrical connection between the first amplifier stage and the second amplifier stage through which the second amplifier stage receives the first output voltage, and coupled to an electrical connection between the first amplifier stage and the second amplifier stage through which the second amplifier stage receives the second output voltage.

Other aspects, advantages and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, like reference numerals will be understood to refer to like parts, components and structures.

DETAILED DESCRIPTION

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The present disclosure relates to an analog amplifier having a wide gain range using one amplification stage by preventing a phenomenon that an input transistor does not operate in the case where it has a very low gain.

Various embodiments of the present disclosure provide an analog amplifier for recovering an abnormal operation of a common-mode feedback.

Figure 2:
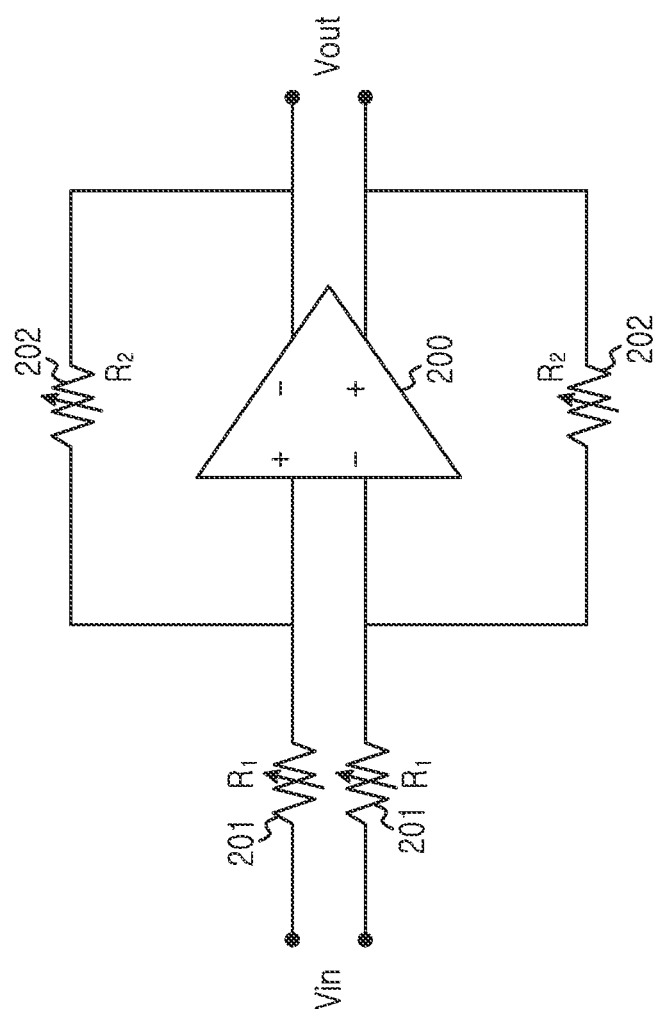
FIG. 2 is a view illustrating an analog variable amplifier according to an embodiment of the present disclosure.

FIG. 2 illustrates an analog variable amplifier according to an embodiment of the present disclosure.

Referring to FIG. 2, the analog variable amplifier has an analog filter structure configured in a first stage. The analog variable amplifier includes an operational amplifier 200, an input resistor $R_1$ 201, and a feedback resistor $R_2$ 202. Here, the input resistor $R_1$ 201 and the feedback resistor $R_2$ 202 may be at least one variable resistor.

Depending on the implementation, the analog variable amplifier may include one variable resistor and one variable capacitor instead of the operational amplifier and the two variable resistors $R_1$ and $R_2$ (201, 202).

In an analog variable amplifier configured in the first stage, a gain is determined by a ratio of the input resistor $R_1$ to the feedback resistor $R_2$. Assuming a transfer function of the operational amplifier 200 is $A(s)$, the gain is given below by Equation (2). In an ideal operational amplifier, a gain has a value of $R_2/R_1$ in its infinity.

$$\text{Gain} = \frac{R_2 A(s)}{R_1 + R_2 - R_1 A(s)} \qquad \text{Equation (2)}$$

In Equation (2), a variable gain amplifier is configured by controlling a value of the input resistor $R_1$ or the feedback resistor $R_2$. In the analog variable amplifier 200, when $R_1$ is greater than $R_2$, the variable gain amplifier performs attenuation. When $R_1$ is less than $R_2$, the variable gain amplifier performs amplification.

Figure 3:
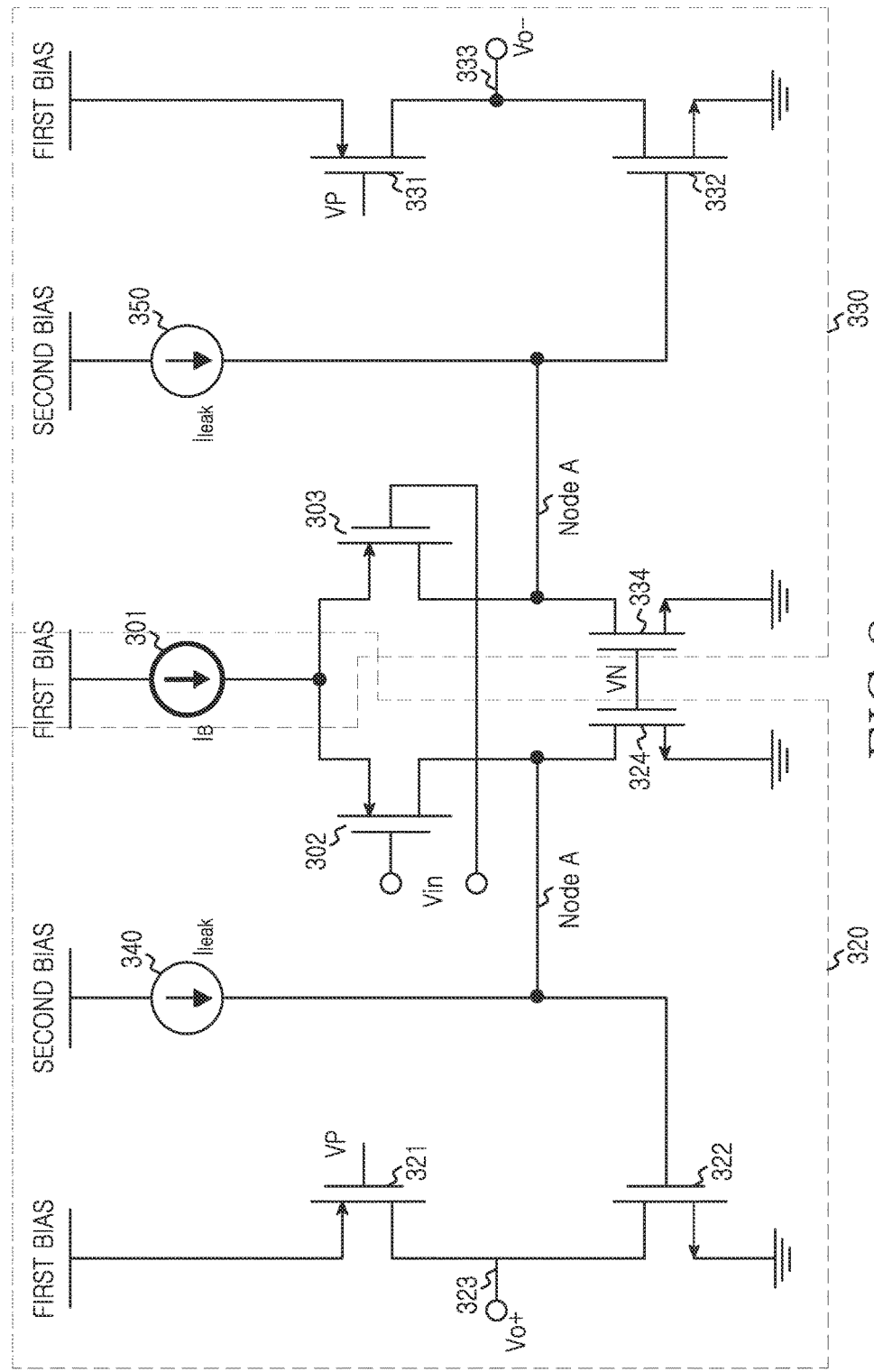
FIG. 3 is a view illustrating a circuit of an operational amplifier according to an embodiment of the present disclosure.

The operational amplifier 200 used inside the analog variable amplifier may have a Complementary Metal-Oxide Semiconductor (CMOS) structure as illustrated in FIG. 3.

FIG. 3 is a view illustrating a circuit of an operational amplifier according to an embodiment of the present disclosure.

Referring to FIG. 3, the operational amplifier 200 is a differential amplifier and includes a common source amplifier configured in two stages. For ease in explanation, the operational amplifier may be divided into half circuits 320 and 330 having a symmetric structure.

In the first common source amplifier circuit 320 and the second common source amplifier circuit 330, a P-type Metal-Oxide Semiconductor (PMOS) bias voltage and an N-type Metal-Oxide Semiconductor (NMOS) bias voltage are supplied to VP (331, 321) and VN (324, 334), respectively. For convenience in description, a common-mode feedback circuit and compensation elements have been omitted.

The differential amplifier includes a first input terminal (i.e., gate of CMOS transistor 302) and a second input terminal (i.e., gate of CMOS transistor 303) to receive two voltage signals, that is, a first voltage and a second voltage. Here, the first voltage and the second voltage may be a positive voltage and a negative voltage, respectively. A bias current input from a current source 301 is amplified depending on each input voltage magnitude and forms an amplified voltage at output resistor terminals 324 and 334, and is input to an input terminal (i.e., gate of CMOS transistors 322 and 332) of the second common-source amplifier. Also, this voltage is amplified by transistors 321 and 322, or transistors 331 and 332 forming the second amplifier, and then is output via output terminals 323 and 333.

In the general case, a voltage differentially input to the input terminals 302 and 303 is amplified by a designed gain and output as a voltage form at the output terminals 323 and 333. A common component of this signal always maintains a constant voltage via a common-mode feedback circuit. That is, a common voltage which is an average of the voltages of the positive output terminal 323 and the negative output terminal 333, and may operate in the normal range. For example, in detail, when the common voltage of the output terminals 323 and 333 is raised simultaneously by an environmental factor (e.g., temperature, operation voltage, etc.) and becomes a voltage close to a voltage source VDD, a VN value (that is, bias voltage provided to gate of CMOS transistor 324 and gate of CMOS transistor 334) is lowered by the common-mode feedback circuit, which raises the voltage of a node A whose phase is opposite to that of the VN, so that the voltage of output terminals 323 and 333 whose phase is opposite to that of the node A is lowered consequently and balance is maintained. In contrast, when the common voltage of the output terminals lowers simultaneously and becomes a voltage close to the ground, a VN voltage is raised by the common-mode feedback circuit, which lowers the voltage of the node A, so that the voltage of the output terminals 323 and 333 is raised and balance is restored.

Figure 4:
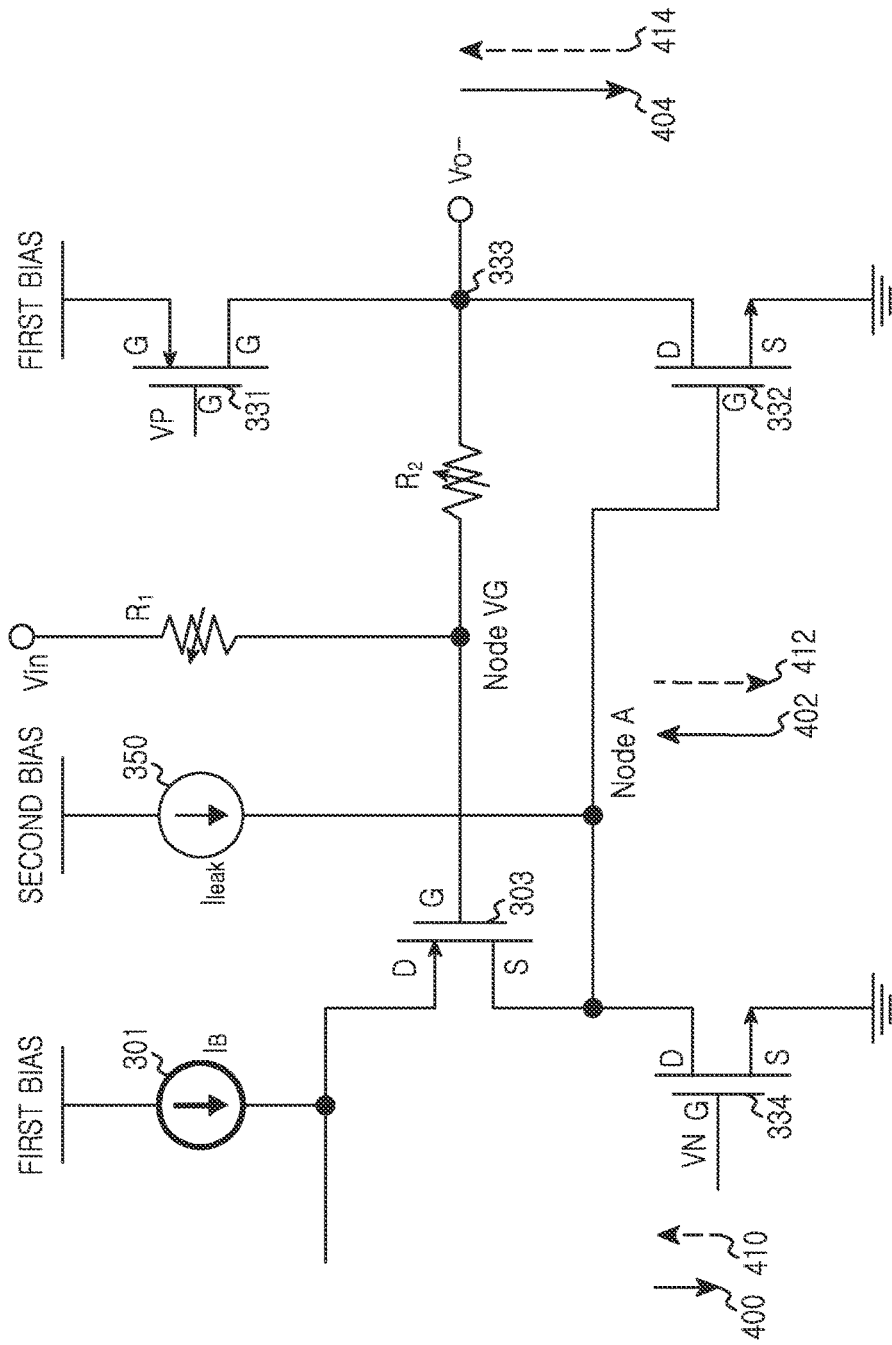
FIG. 4 is a view illustrating a cut-off circuit of an operational amplifier according to an embodiment of the present disclosure.

FIG. 4 is a view illustrating a cut-off circuit of an operational amplifier according to an embodiment of the present disclosure.

FIG. 4 illustrates the half of the differential amplifier 300 and the second common source amplifier circuit 330 in the operational amplifier of FIG. 3. Also, FIG. 4 additionally illustrates the input resistor $R_1$ and the feedback resistor $R_2$ of FIG. 2.

In the case where set attenuation of the differential amplifier is large and so the input resistor $R_1$ is considerably greater than the feedback resistor $R_2$, a phenomenon that the input transistor 303 of the differential amplifier 300 does not operate due to a resistance ratio when one amplification stage processes a signal may occur. For example, in the case where a gain is −20 dB, a signal is attenuated by 1/10, and $R_1$ should be ten times greater than $R_2$. Likewise, in the case where a gain is −40 dB, $R_1$ becomes a hundred times greater than $R_2$. That is, when an attenuation range is widened, a ratio of $R_1$ to $R_2$ increases very much. In the case where $R_1$ becomes excessively larger than $R_2$ as described above, a possibility occurs that the input transistor 303 of the differential amplifier 300 in the analog variable amplifier does not operate.

In a case of the general operation, a balance point is restored by controlling the voltage of the VN via the common-mode feedback circuit as described above.

For example, when the VN which is a bias voltage of the first stage is raised (410) by an environmental factor (e.g., temperature, operation voltage, etc.) and becomes a voltage close to a voltage source VDD, the voltage of the node A is lowered by the common-mode feedback circuit (400, 412). When the voltage of the node A is lowered, an output voltage Vo− may be raised (414). To maintain a balance, the voltage of the node A whose phase is opposite to that of the VN is raised (402), and consequently the voltage of the output terminal 333 whose phase is opposite to that of the node A is lowered and a balance may be maintained (404). In contrast, when the common voltage of the output terminal is lowered simultaneously (404) and becomes a voltage close to the ground, the VN value is raised by the common-mode feedback circuit (410), which lowers the voltage of the node A (412), so that the voltage of the output terminal 333 is raised and a balance is restored.

However, in the case where the input resistor $R_1$ is considerably larger than the feedback resistor $R_2$, compensation by the common-mode feedback circuit does not operate, which will be described below.

A voltage supplied to a node VG which is the virtual ground is given below by Equation (3) via a resistance divider. When $R_1$ becomes excessively larger than $R_2$, when $V_{0−}$ becomes a voltage close to VDD, the voltage close to the voltage source VDD is applied to the node VG which is a gate of the input transistors 302 and 303 of the differential amplifier.

$$V_{VG} = \frac{R_1 V_{0-} + R_2 V_{in}}{R_1 + R_2} \qquad \text{Equation (3)}$$

Figure 1:
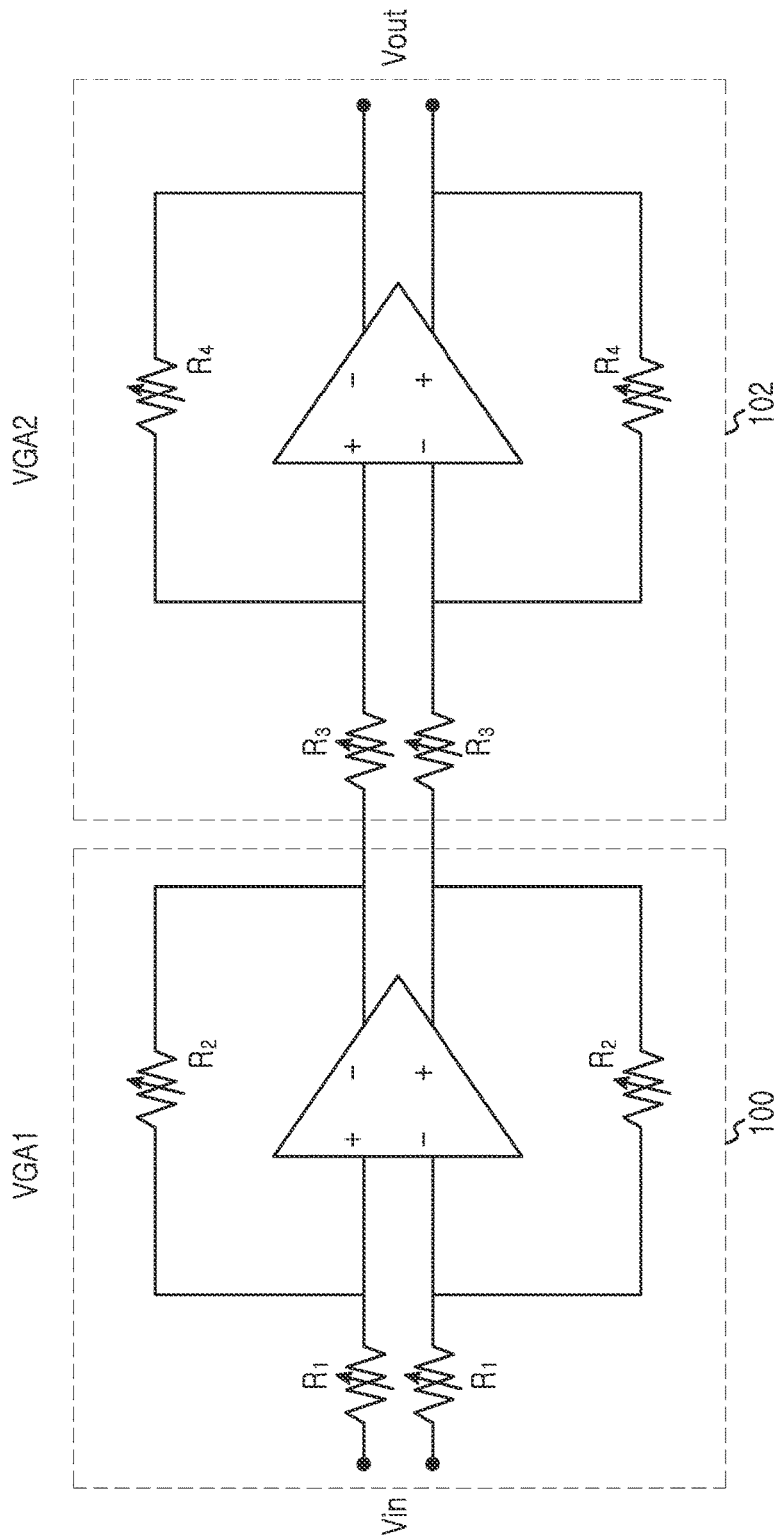
FIG. 1 is a view illustrating an analog filter structure where an analog variable amplifier is configured in two stages according to the related art.

At this point, a voltage Vgs applied to the gate and the source of the input NMOS transistor 303 of the differential amplifier 300 becomes lower than a threshold voltage of the input NMOS transistor 303, so that the input transistor is turned off. Accordingly, a current does not flow through the first PMOS transistor 332, so that even when the VN voltage of the second PMOS transistor 334 is lowered, the voltage of the node A is not restored. This phenomenon conspicuously occurs in the case where a supply voltage is low and temperature is low, and direct relation to yield occurs. Therefore, to avoid this phenomenon, the related-art connects amplifier stages having a gain whose operation range is small in series and uses the same as illustrated in FIG. 1. As described above, the related-art has disadvantages of consuming much power and occupying a large area.

Therefore, current sources 340 and 350 allowing a fine current to flow through the node A are provided inside the operational amplifier.

The current sources $I_{leak}$ supplied to the node A are added to the first common-source amplifier circuit 320 and the second common-source amplifier circuit 330, and 1/10∼1/100 of the bias current $I_B$ 301 supplied to the main amplifier is appropriate for the magnitude of the current. When the added fine current source is too large, a mismatch increases at both terminals and the entire power consumption may increase. However, in the present disclosure, the magnitude of the current source supplied to the node A is not limited.

As described above, under an environment where the output voltage $V_{0−}$ is raised, even in the state where a node VG approaches VDD due to a resistance divider and the input transistor 303 of the differential amplifier does not operate, a current is supplied to the node A via the current source $I_{leak}$ and the voltage of the node A is raised again under control of the second PMOS transistor 334 and consequently the operation range of the output voltage $V_{0−}$ is lowered.

Though the present disclosure has exemplarily described a common-source amplifier using a CMOS transistor, it is applicable to a common-gate amplifier and a common-drain amplifier, and the analog amplifier of FIG. 4 may be configured using a Bi-polar Junction Transistor (BJT) instead of a CMOS transistor.

As described above, the present disclosure processes an analog signal using a single stage or a smaller number of stages via an operational amplifier circuit that may apply amplification and attenuation of an analog signal over a wide range simultaneously, so that power consumption may be reduced, a circuit area may be reduced, and so manufacturing costs may be saved.

Also, the present disclosure may increase reliability of a circuit operation and also expect yield improvement by including a current source supplying a fine current inside the circuit to prevent the operation of an input transistor from being cut-off Particularly, the present disclosure has an effect of securing operation reliability of an operational amplifier under a poor environment such as a low voltage and low temperature.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An analog variable amplifier comprising:
a first amplifier stage configured to amplify a bias current to output a first output voltage and a second output voltage that respectively depend on a magnitude of a first input voltage and a second input voltage;
a second amplifier stage configured to receive the first output voltage and the second output voltage of the first amplifier stage as inputs and to amplify the received first output voltage and the second output voltage; and
at least one auxiliary bias current source coupled to a first electrical connection between the first amplifier stage and the second amplifier stage through which the second amplifier stage receives the first output voltage, and coupled to a second electrical connection between the first amplifier stage and the second amplifier stage through which the second amplifier stage receives the second output voltage,
wherein the at least one auxiliary bias current source causes that:
a first predetermined current is drawn at the first electrical connection between the first amplifier stage and the second amplifier stage through which the second amplifier stage receives the first output voltage, and
a second predetermined current is drawn at the second electrical connection between the first amplifier stage and the second amplifier stage through which the second amplifier stage receives the second output voltage, and
wherein the first electrical connection and the second electrical connection are arranged independently from each other.

2. The analog variable amplifier of claim 1, wherein the first amplifier stage includes a first output transistor for outputting the first output voltage and a second output transistor for outputting the second output voltage.

3. The analog variable amplifier of claim 2, wherein the first amplifier stage further includes a first input transistor for amplifying the bias current depending on the magnitude of the first input voltage and a second input transistor for amplifying the bias current depending on the magnitude of the second input voltage.

4. The analog variable amplifier of claim 2, wherein the first amplifier stage further includes at least one passive load.

5. The analog variable amplifier of claim 2, wherein the first input transistor and the second input transistor are P-type Metal-Oxide Semiconductor (PMOS) transistors.

6. The analog variable amplifier of claim 2, wherein the first input transistor and the second input transistor are N-type Metal-Oxide Semiconductor (NMOS) transistors.

7. The analog variable amplifier of claim 1, wherein the second amplifier stage includes a first transistor for receiving the first output voltage and a second transistor for receiving the second output voltage.

8. The analog variable amplifier of claim 7, wherein the second amplifier stage includes a third transistor for amplifying the received first output voltage and a fourth transistor for amplifying the received second output voltage.

9. The analog variable amplifier of claim 7, wherein the second amplifier stage further includes at least one passive load.

10. The analog variable amplifier of claim 7, wherein the first transistor and the second transistor are P-type Metal-Oxide Semiconductor (PMOS) transistors.

11. The analog variable amplifier of claim 7, wherein the first transistor and the second transistor are N-type Metal-Oxide Semiconductor (NMOS) transistors.

12. The analog variable amplifier of claim 1, wherein the at least one auxiliary bias current source is configured to:
provide a predetermined current to the first electrical connection between the first amplifier stage and the second amplifier stage through which the second amplifier stage receives the first output voltage, and
provide the predetermined current to the second electrical connection between the first amplifier stage and the second amplifier stage through which the second amplifier stage receives the second output voltage.

13. The analog variable amplifier of claim 12, wherein the predetermined current is smaller than the bias current.

14. The analog variable amplifier of claim 13, wherein the predetermined current is smaller than one of $\frac{1}{10}$ and $\frac{1}{100}$ of the bias current.

15. The analog variable amplifier of claim 12, wherein the predetermined current prevents a voltage of transistors of the first amplifier stage from dropping down to a threshold or less.

16. The analog variable amplifier of claim 1, wherein the predetermined current is smaller than the bias current.

17. The analog variable amplifier of claim 16, wherein the predetermined current is smaller than one of $\frac{1}{10}$ and $\frac{1}{100}$ of the bias current.

18. The analog variable amplifier of claim 1, wherein the predetermined current prevents a voltage of transistors of the first amplifier stage from dropping down to a threshold or less.

19. The analog variable amplifier of claim 1, wherein the second amplifier stage performs class-A amplification.

* * * * *